(12) United States Patent
Wang

(10) Patent No.: US 11,245,373 B2
(45) Date of Patent: Feb. 8, 2022

(54) AMPLIFIER CIRCUITRY AND METHOD OF AMPLIFICATION

(71) Applicants: Kabushiki Kaisha Toshiba, Tokyo (JP); Toshiba Electronic Devices & Storage Corporation, Tokyo (JP)

(72) Inventor: Tong Wang, Kawasaki Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 18 days.

(21) Appl. No.: 16/811,039

(22) Filed: Mar. 6, 2020

(65) Prior Publication Data
US 2021/0083638 A1 Mar. 18, 2021

(30) Foreign Application Priority Data

Sep. 13, 2019 (JP) .............................. JP2019-167166

(51) Int. Cl.
*H03G 3/30* (2006.01)
*H03F 1/02* (2006.01)
*H03F 3/21* (2006.01)
*H04B 1/40* (2015.01)

(52) U.S. Cl.
CPC ......... *H03G 3/3047* (2013.01); *H03F 1/0211* (2013.01); *H03F 3/211* (2013.01); *H03F 2200/451* (2013.01); *H04B 1/40* (2013.01)

(58) Field of Classification Search
CPC ..... H03G 3/3047; H03F 1/0211; H03F 3/211; H03F 2200/451; H04B 1/40
USPC ........................................................ 330/296
See application file for complete search history.

(56) References Cited

U.S. PATENT DOCUMENTS

| 7,738,845 | B2 | 6/2010 | Takahashi et al. | |
| 7,994,860 | B2 | 8/2011 | Takahashi et al. | |
| 2021/0006212 | A1* | 1/2021 | Watanabe | H01L 27/146 |

FOREIGN PATENT DOCUMENTS

| JP | 2007-116651 A | 5/2007 |
| JP | 5200853 B2 | 6/2013 |
| JP | 2015-106790 A | 6/2015 |
| JP | 6340191 B2 | 6/2018 |

\* cited by examiner

*Primary Examiner* — Hafizur Rahman
(74) *Attorney, Agent, or Firm* — Allen & Overy LLP

(57) ABSTRACT

An amplifier includes a first circuitry, a second circuitry, and a plurality of amplifier circuitries. The first circuitry controls an enable signal. The second circuitry controls a bias signal. Circuitries which output signals are decided from among the plurality of circuitries based on the enable signal, and each of the circuitries which output the signals amplifies an input signal with a gain corresponding to the bias signal.

9 Claims, 6 Drawing Sheets

AMPLIFIER CIRCUITRY AND METHOD OF AMPLIFICATION

CROSS REFERENCE TO THE RELATED APPLICATIONS

This application is based upon and claims the benefit of priority from the Japanese Patent Application No. 2019-167166, filed on Sep. 13, 2019, the entire contents of which are incorporated herein by reference.

FIELD

The embodiments of the present invention relate to an amplifier circuitry and a method of amplification.

BACKGROUND

In an amplitude-shift keying (ASK) transmitter using a switching power amplifier (PA), it is necessary to smooth the rising and falling of the output power of the PA in order to suppress the radiation of a spurious wave. This is because if steep rising and falling occur at timing when amplifying an RF input signal based on a control signal, the envelope of an RF output signal becomes a waveform close to that of a rectangular wave, but the Fourier transform of the rectangular wave becomes $f(x)=(4/n)[\sin(x)+(1/3)\sin(3x)+\ldots]$, resulting in generation of a spectrum based on the Fourier coefficient corresponding to the term of an odd-multiple sine wave. As a result of this, for example, when the steep rising occurs, the radiation of the spurious wave increases to increase the probability of violating the Radio Law.

However, it is difficult to realize the control of the smooth output power with respect to the input signal. This is because both transfer functions of the control of the bias voltage and the control of the number of cells to be turned on are rough when their numerical values are small and are saturated when their numerical values become large, due to the characteristics of a transistor.

DETAILED DESCRIPTION

Figure 1:
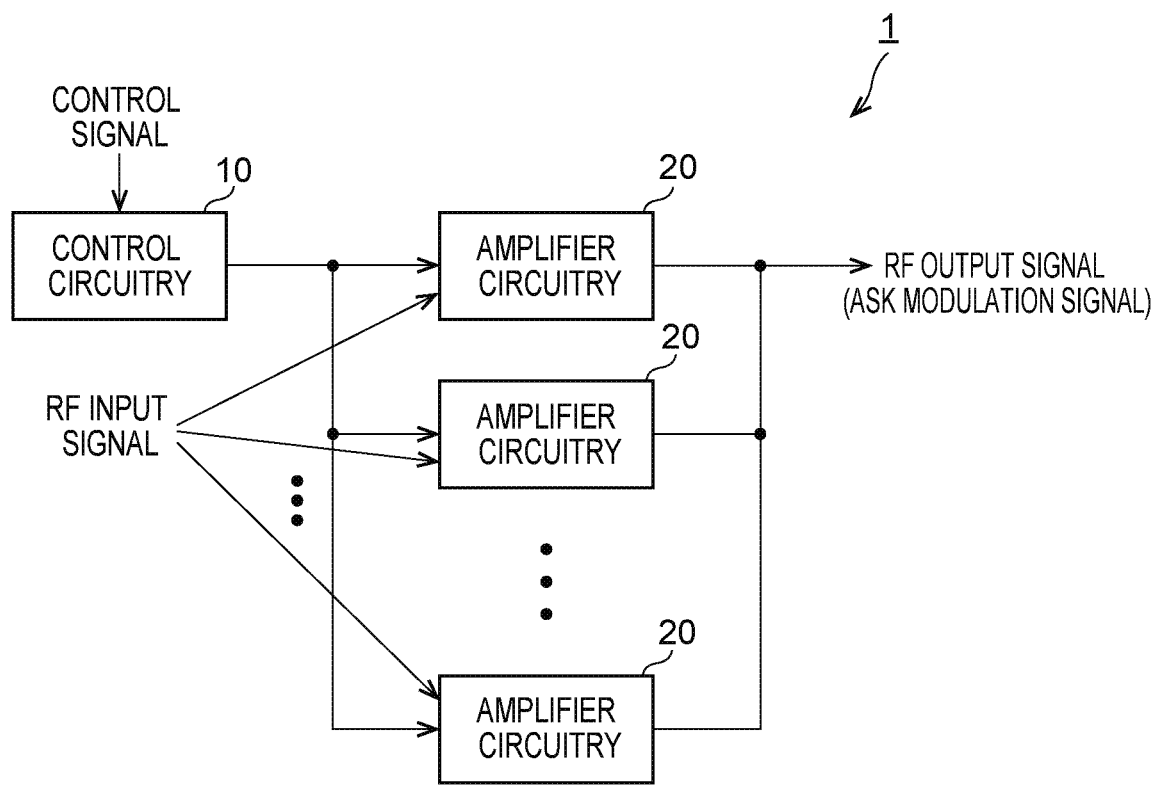
FIG. 1 is a block diagram schematically illustrating an amplifier according to an embodiment.

According to an embodiment, an amplifier includes a first circuitry, a second circuitry, and a plurality of amplifier circuitries. The first circuitry controls an enable signal. The second circuitry controls a bias signal. Circuitries which output signals are decided from among the plurality of circuitries based on the enable signal, and each of the circuitries which output the signals amplifies an input signal with a gain corresponding to the bias signal.

Hereinafter, the embodiment is explained referring to the drawings. Note that the strength of a signal is used as a word representing the strength based on the magnitude of the amplitude of the signal in the explanation.

FIG. 1 is a block diagram schematically illustrating an amplifier according to an embodiment. An amplifier 1 includes a control circuitry 10 and a plurality of amplifier circuitries 20, and amplifies an RF input signal by the amplifier circuitries 20 based on a control signal and outputs the amplified signal. More specifically, the amplifier 1 outputs a signal output from one amplifier circuitry 20 obtained by performing amplification using the one amplifier circuitry 20 and amplifying the RF input signal by controlling a bias voltage to be applied to the one amplifier circuitry 20 by the control circuitry 10 based on the control signal, or outputs a signal obtained by performing amplification using some of the plurality of amplifier circuitries 20 and amplifying the RF input signal by controlling a bias voltage to be applied to the plurality of amplifier circuitries 20 by the control circuitry 10 based on the control signal and superimposing signals output from the plurality of amplifier circuitries 20.

The control circuitry 10 controls the amplifier circuitries 20. The control circuitry 10 mainly controls which amplifier circuitries 20 of the plurality of amplifier circuitries 20 are enabled, and controls the bias to be applied to each of the amplifier circuitries 20. Into the control circuitry 10, for example, a digital control signal (control code) is input, and the control signal for controlling the amplifier circuitries 20 is output based on the digital control signal.

The amplifier circuitry 20 is, for example, an amplifier circuitry including transistors. When the enable signal is applied, the amplifier circuitry 20 amplifies the input signal and outputs the amplified signal. Further, the amplifier circuitry 20 has an amplification factor decided based on the bias signal, and outputs the amplified signal.

Into the plurality of amplifier circuitries 20, the RF input signal is input, the RF input signal is amplified in the amplifier circuitries 20 enabled by the control circuitry 10, and the output signals from them are superimposed and output from the amplifier 1. The amplification factor for the RF input signal in each of the amplifier circuitries 20 is decided based on the bias signal input from the control circuitry 10.

Figure 2:
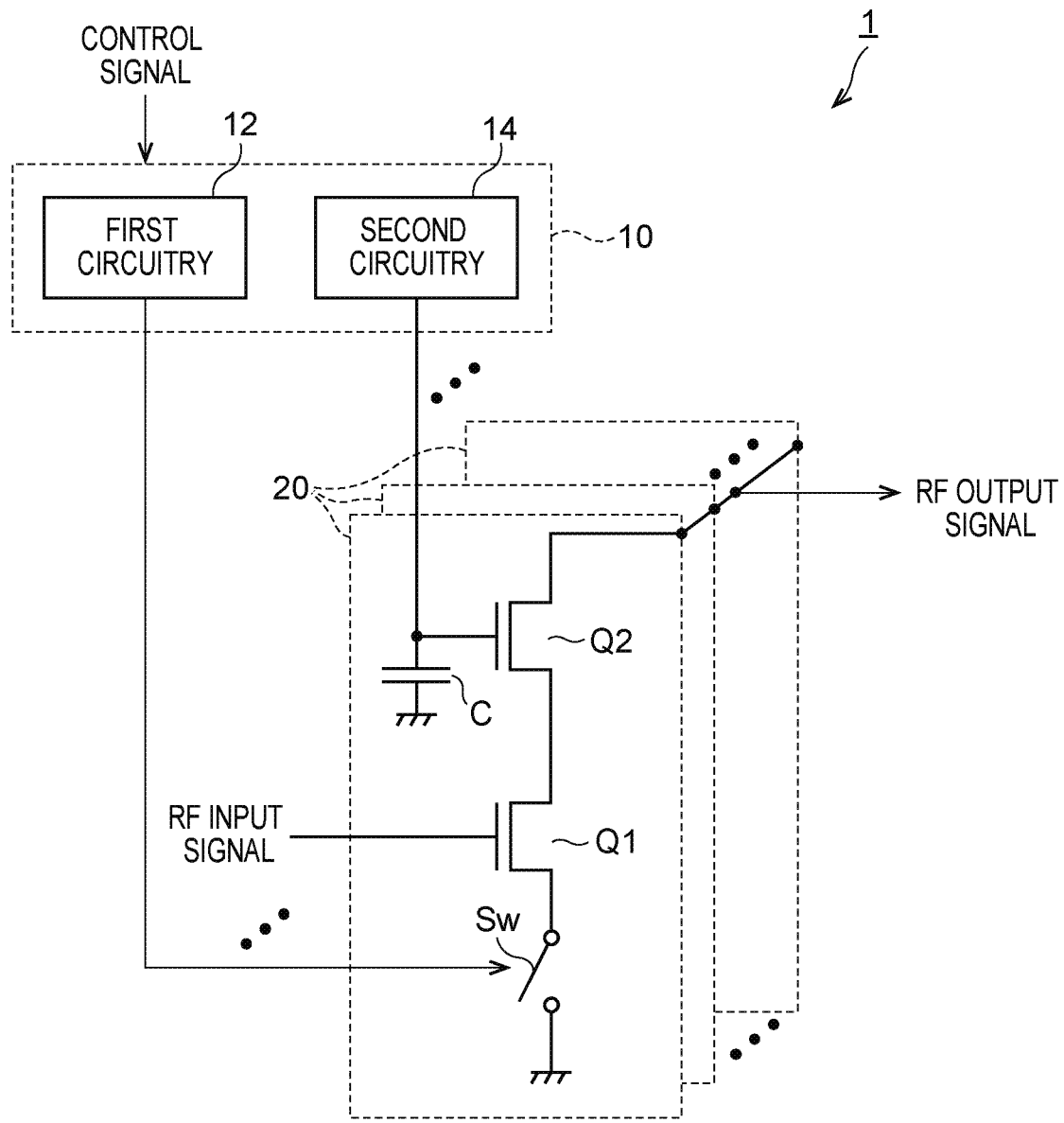
FIG. 2 is a circuitry diagram schematically illustrating the amplifier according to an embodiment.

FIG. 2 is a circuitry diagram schematically illustrating the amplifier 1. Though the coupling with a power supply voltage or the like is omitted, it is assumed that suitable coupling with the power supply voltage or the like is established.

The control circuitry 10 includes a first circuitry 12 and a second circuitry 14. Into the first circuitry 12 and the second circuitry 14, a control signal is input. This control signal is a signal obtained by converting the baseband signal being, for example, a digital signal having two values such as 0, 1 into a control code. Besides, as another example, the control circuitry 10 may further include a circuitry which converts the baseband signal from a digital signal to a control code, and an output from the converting circuitry may be coupled to the first circuitry 12 and to the second circuitry 14.

The first circuitry 12 is a circuitry which outputs the enable signal for selecting an output from which amplifier circuitry 20 is made active. To which amplifier circuitry 20 the enable signal is output is decided based on the control code. The enable signal controls output of the signal from the amplifier circuitry 20. For example, the more amplifier circuitries 20 into which the enable signal output from the first circuitry 12 is input, the more the strength of the signal output from the amplifier 1 increases.

The second circuitry 14 is a circuitry which outputs the bias signal for deciding the amplification factor between input and output in each of the amplifier circuitries 20. The bias signal is output to each of the amplifier circuitries 20 based on the control code. The bias signal controls the amplification factor of the signal to be output from the amplifier circuitry 20. For example, an increase in the strength of the bias signal increases the strength of the signal to be output from each of the amplifier circuitries 20. In the case where the bias signal is a voltage, when the voltage applied by the second circuitry 14 is increased, the strength of the signal to be output from the amplifier circuitry 20 increases.

The outputs of the first circuitry 12 and the second circuitry 14 are coupled to each of the plurality of amplifier circuitries 20.

The amplifier circuitry 20 includes a switch Sw, a first transistor Q1, a second transistor Q2, and a capacitor C.

The switch Sw is provided, for example, between a source of the first transistor Q1 and a ground point. When the switch Sw is turned on, the amplitude of the input signal is amplified and the amplified signal is output. This switch Sw only needs to be the one which can appropriately control the output, and may be provided to be coupled, for example, to a gate of the first transistor Q1. The switch Sw may be the one which includes, for example, an n-type MOSFET having a gate to which the enable signal, namely, the output from the first circuitry 12 may be applied, or may be a circuitry which may become another switch such as a bipolar transistor, a relay circuitry or the like.

The first transistor Q1 is, for example, an n-type MOSFET. The first transistor Q1 has a gate into which the input signal is applied. When the switch Sw is on and the voltage of the applied input signal exceeds a threshold voltage, a drain current of the first transistor Q1 flows, and the signal amplified in amplitude is output from the amplifier circuitry 20.

The second transistor Q2 is, for example, an n-type MOSFET. The second transistor Q2 has a gate into which the bias signal, namely, the output from the second circuitry 14 is coupled. The second transistor Q2 is cascode-coupled to the first transistor Q1.

As illustrated in the drawing, the gate of the second transistor Q2 may be grounded via the capacitor C. When the capacitor C is provided in this manner, a high-frequency component can be cut between the second circuitry 14 and the second transistor Q2.

The first circuitry 12 is coupled to the amplifier circuitry 20 in such a way as to turn on/off the switch Sw of each of the plurality of amplifier circuitries 20. Besides, the second circuitry 14 is coupled to the gate of the second transistor Q2 of each of the plurality of amplifier circuitries 20, and outputs the bias signal to each of the amplifier circuitries 20. Such coupling makes it possible to control the outputs from the amplifier circuitries 20 which are to be superimposed based on the signal from the control circuitry 10, and to control the strength of the signal to be output from the amplifier 1.

Figure 3:
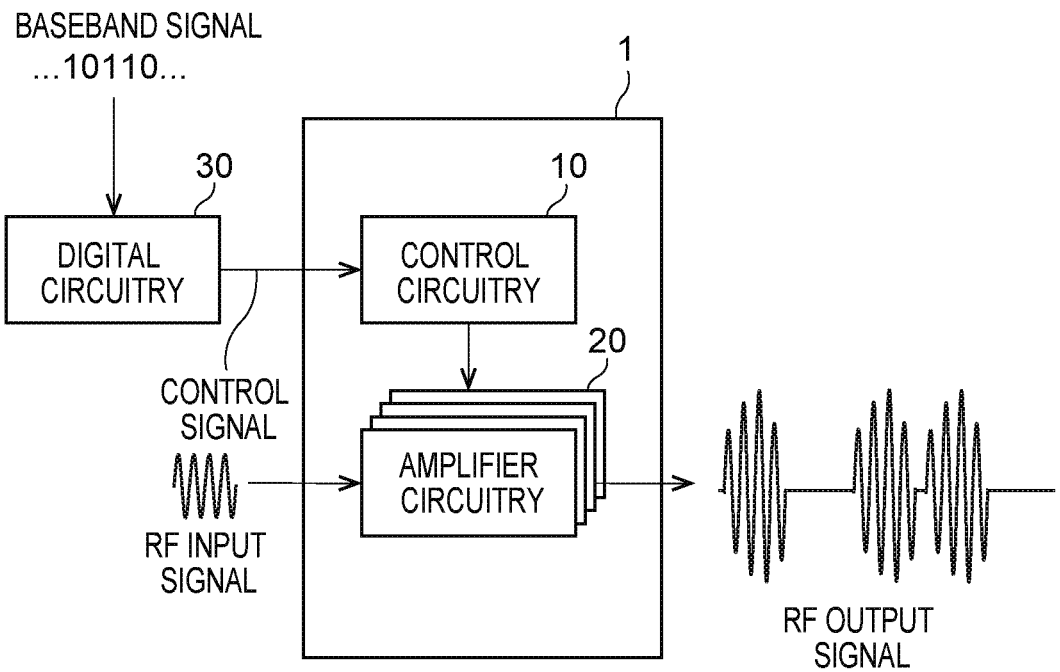
FIG. 3 is a diagram illustrating a use example of the amplifier according to an embodiment.

FIG. 3 is an example of signal processing using the amplifier 1 according to the embodiment. For example, in the case of modulating and transmitting the digital signal, the amplifier 1 is used. The amplifier 1 is used, for example, for ASK modulation, and can be used also in FSK (Frequency Shift Keying). In the case of communication using the amplifier requiring switching as in the above manner, the amplifier 1 can be used. For example, the amplifier 1 can be used for ETC (Electronic Toll Collection System), a keyless entry, an RFID tag or the like.

The digital signal (baseband signal) to be modulated is converted into a control code by a digital circuitry 30. The digital circuitry 30 includes, for example, a digital filter which limits the band of a baseband signal, and a circuitry which converts an output from the digital filter into a control code of the amplifier 1. The control code is set, for example, to 0 as an initial value, and increases one by one every predetermined time up to a maximum value MAX when a rise of the signal is detected. Conversely, the control code decreases one by one every predetermined time from MAX to 0, for example, when falling of the signal is detected. The digital circuitry 30 generates the above control code.

Into the control circuitry 10 of the amplifier 1, the converted control code is input. The control circuitry 10 outputs the control signal to the amplifier circuitry 20 based on the control code.

Into the amplifier circuitry 20, an RF input signal used for modulation is input. The RF input signal is continuously applied to the gate of the first transistor Q1 illustrated in FIG. 2. The amplifier circuitry 20 into which the enable signal has been input from the control circuitry 10 amplifies the RF input signal and outputs the amplified signal. The amplification factor is decided based on the bias signal input from the control circuitry 10.

In other words, the strength of a modulation signal to be output is decided depending on the number of the amplifier circuitries 20 into which the enable signal is input and on the magnitude of the bias signal. As explained above, the control circuitry 10 controls the amplifier circuitries 20 based on the control code.

More specifically, when the control code is small, both the number of the amplifier circuitries 20 to be turned on and the magnitude of the bias signal are decreased. With an increase in control code, the number of the amplifier circuitries 20 to be turned on is increased and the strength of the bias signal is increased. The behaviors of the plurality of amplifier circuitries 20 are controlled by the first circuitry 12 and the second circuitry 14 of the control circuitry 10 as explained above.

Figure 4:
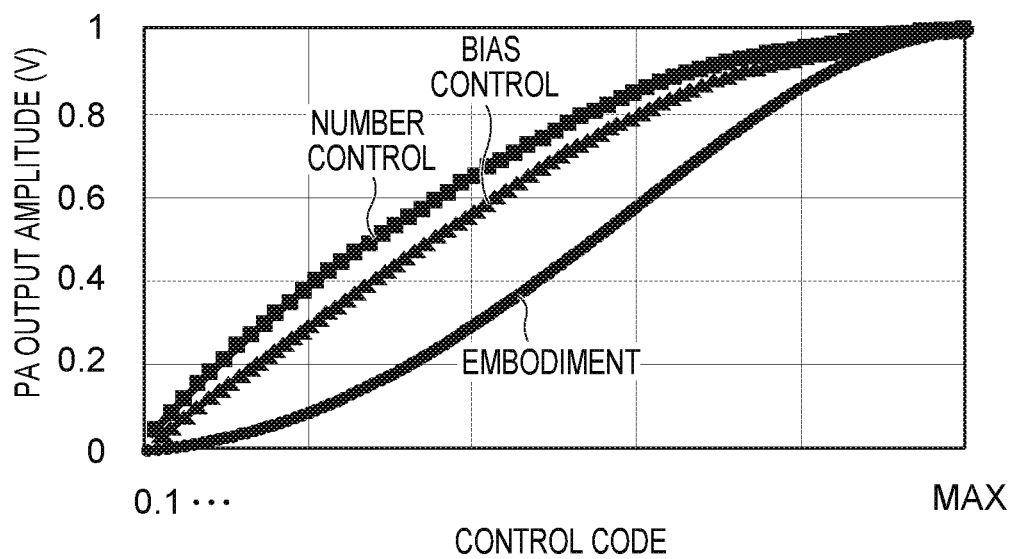
FIG. 4 is a graph illustrating an amplitude value of an output voltage according to an embodiment.

FIG. 4 is a graph illustrating the strength of the output signal when the control by the first circuitry 12 and the control by the second circuitry 14 are alternately performed in the amplifier 1 according to this embodiment. As comparative examples, a graph obtained by controlling only the number of the amplifier circuitries 20 to be turned on with the bias signal set to a fixed value and a graph obtained by controlling only the bias signal with the number of the amplifier circuitries 20 to be turned on set to a fixed value, are illustrated. The horizontal axis indicates the control code and the vertical axis indicates the output voltage. Note that the vertical axis indicates the output voltage when the output is set to 1 V, and the magnitude of the output voltage can be arbitrarily changed within a range limited by the power supply voltage.

The alternately performing the controls means, for example, the following processing. The first circuitry 12 can arbitrarily output the enable signal, for example, to 0 ton amplifier circuitries 20. The second circuitry 14 can output, for example, the bias signal which gradually increases at a predetermined number of steps between the outputtable minimum value to maximum value. The number of steps is decided, for example, according to the characteristics of the transistor and the like included in the second circuitry 14.

The first circuitry 12 outputs the enable signal to 0 amplifier circuitry 20 in an initial state (for example, a control code=0). On the other hand, the second circuitry 14 outputs the bias signal in an outputtable lowest state to each of the amplifier circuitries 20 in the initial state.

At timing when the control code becomes 1, the first circuitry 12 outputs the enable signal to one amplifier circuitry 20.

At timing when the control code becomes 2, the second circuitry 14 outputs the bias signal in a second lowest state (the bias signal in a state of increasing one step from the minimum value) to each of the amplifier circuitries 20.

At timing when the control code becomes 3, the first circuitry 12 outputs the enable signal to two amplifier circuitries 20.

By repeating this control, the number of the amplifier circuitries 20 which output signals and the amplification factor in each of the amplifier circuitries 20 are controlled, and an amplified signal is output. Note that when alternately performing the controls, the control may be started from the second circuitry 14. Further, the initial value of the second circuitry 14 may be set to 0.

As is found from FIG. 4, when the number of the amplifier circuitries 20 which output signals and the strength of the bias signal are alternately controlled, the strength of the output signal changes more continuously and linearly or sinusoidally than those in the comparative examples.

Though the example in which the output of the first circuitry 12 and the output of the second circuitry 14 are alternately increased is illustrated in FIG. 4, these controls do not need to be alternate. The output of the first circuitry 12 and the output of the second circuitry 14 may be controlled based on the control code so as to form a more appropriate envelope shape.

For example, when the envelope of the output signal approaches the shape of a part of a straight line or a sine wave at the rising and falling, the frequency component other than a desired frequency becomes smaller as compared with a rectangular wave having steep rising and falling, and thereby enabling suppression of radiation of a spurious wave.

Figure 5:
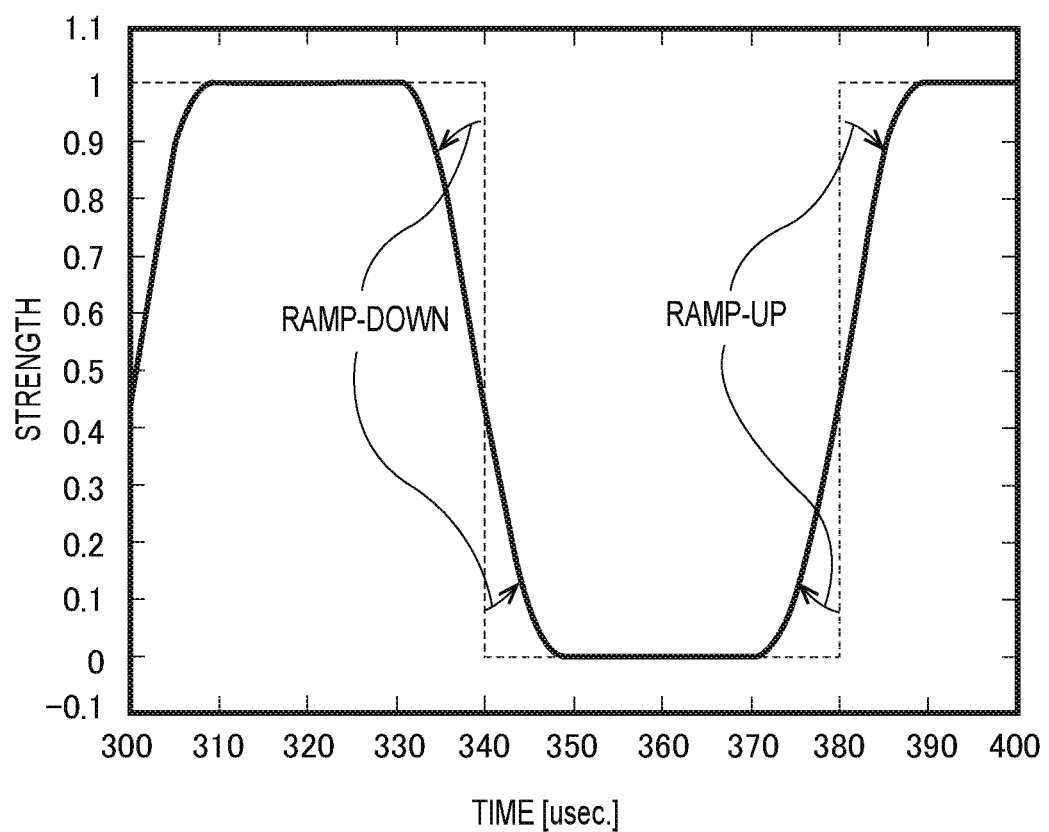
FIG. 5 is a graph indicating an output example of the amplifier according to an embodiment.

FIG. 5 is a graph indicating the envelope of the output signal when the controls in the first circuitry 12 and the second circuitry 14 are alternately performed as explained above. The vertical axis indicates the normalized strength of the output signal, and the horizontal axis indicates time.

A graph indicated with a broken line is obtained by theoretically performing amplification based on the rising and falling of the baseband signal, in which the transitions from 0 to 1 and from 1 to 0 are instantaneously performed. In contrast to the above, a graph indicated with a solid line is the output strength when performing the above-explained controls according to the embodiment. It is found that by performing the control of amplification of the RF input signal by the amplifier 1 as explained above, the transitions of the rising and falling are smoothed. The transition becoming a smooth rising waveform is described as a ramp-up, and the transition becoming a smooth falling waveform is described as ramp-down.

As explained above, according to the embodiment, when the digital signal is encoded using a high-frequency signal, the digital signal can be smoothly changed while avoiding a rapid change, thereby suppressing radiation of the spurious wave. According to the amplifier 1, the waveform of the modulated signal can be made into a ramped-up and ramped-down waveform. Improving the accuracy of power control as explained above enables the suppression of the radiation of the spurious wave.

Figure 6:
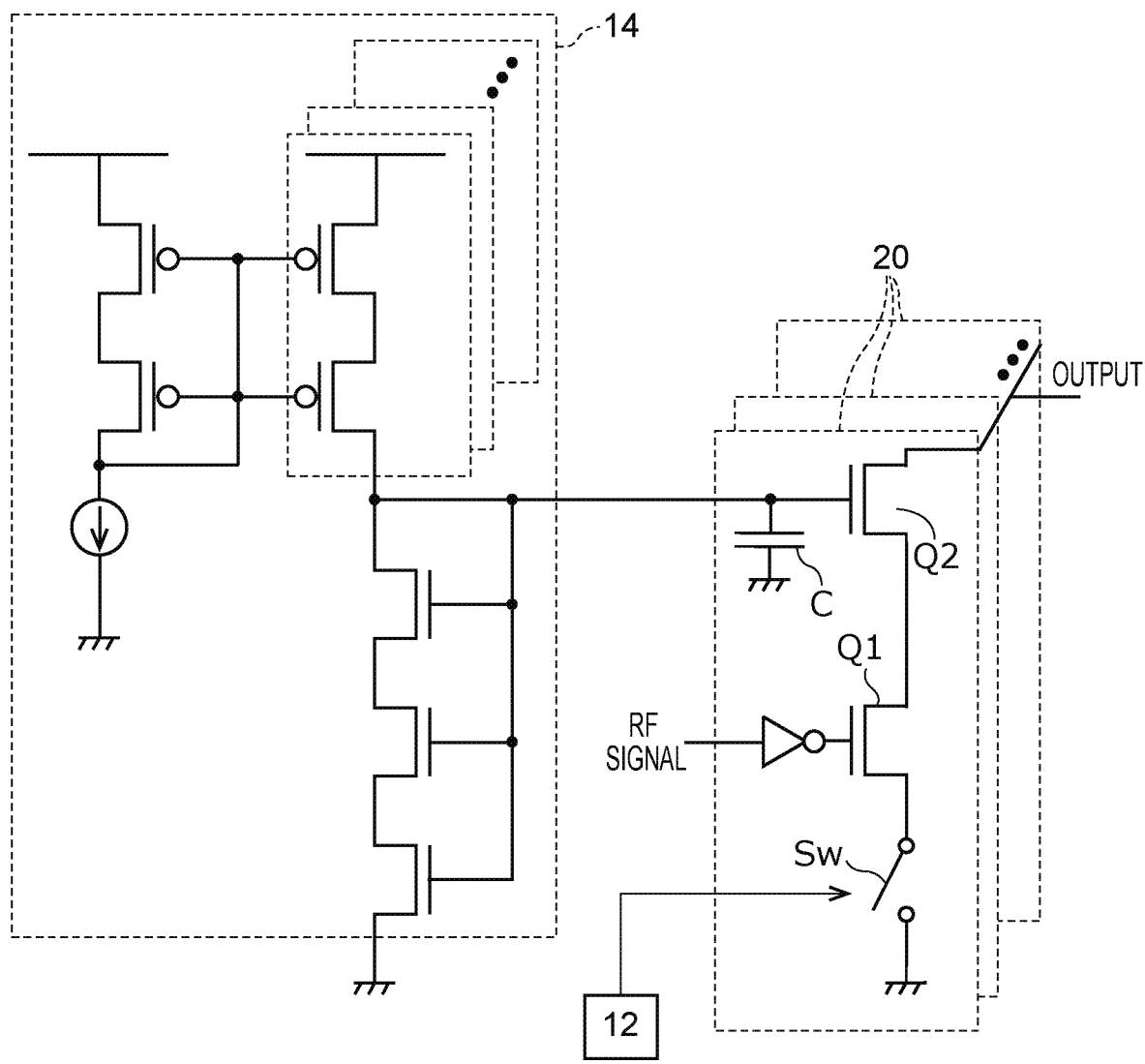
FIG. 6 is a diagram illustrating a mounting example of the amplifier according to an embodiment.

FIG. 6 is a diagram illustrating a mounting example of the amplifier 1. The first circuitry 12 outputs the enable signal to the amplifier circuitry 20 based on the input signal as explained above.

The second circuitry 14 is configured to include, for example, multiplexed current mirrors with respect to a reference current. The currents output from the respective current mirrors are superimposed and grounded, for example, via a diode-coupled n-type MOSFET. The n-type MOSFET forms a current mirror with a plurality of second transistors Q2 and outputs a bias signal to the plurality of amplifier circuitries 20.

By multiplexing the current mirrors of the second circuitry 14, the more current mirrors become active, the more the voltage to be applied to the source of the n-type MOSFET increases to increase the average currents flowing through the first transistors Q1 and the second transistors Q2. The second circuitry 14 controls the number of output circuitries of the driving current mirrors as explained above, and thereby controls the bias signal.

Figure 7:
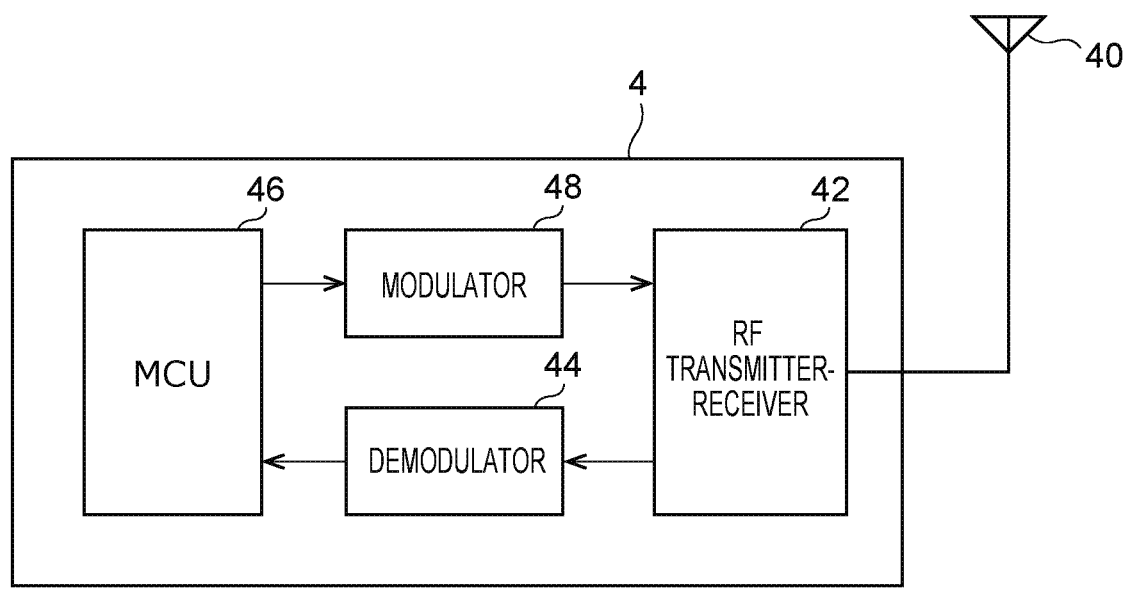
FIG. 7 is a diagram illustrating a use example of the amplifier according to an embodiment.

FIG. 7 is a diagram illustrating a use example of the amplifier 1 according to this embodiment. A communication device 4 in FIG. 7 is provided, for example, in a keyless entry of an automobile or the like. The communication device 4 includes an antenna 40, an RF transmitter-receiver 42, a demodulator 44, an MCU 46, and a modulator 48. The communication device 4 includes a transmitting function which converts a digital signal into an RF signal and transmits the RF signal, and a receiving function which converts the received signal into a digital signal. Note that the communication device having the transmitting and receiving functions is illustrated in FIG. 7 but, not limited to this, a communication device having only the transmitting function may be provided.

The antenna 40 is an antenna which transmits the signal from the communication device 4 or receives a signal from the external part. One antenna 40 is illustrated in the drawing but, not limited to this, a plurality of antennas may be provided.

The RF transmitter-receiver 42 performs processing of the reception signal received by the antenna 40 and transmission processing of the transmission signal amplified by the amplifier 1. For example, the RF transmitter-receiver 42 includes a transmission/reception circuitry and a PLL (Phase Locked Loop) circuitry. The PLL circuitry is controlled by the MCU 46 to output an oscillation output of a predetermined frequency. In transmission, the transmission/reception circuitry generates an RF signal using the output of the PLL circuitry. In reception, the transmission/reception circuitry outputs the reception signal from the antenna 40 to the demodulator 44.

The demodulator 44 demodulates the reception signal by a demodulation scheme corresponding to the modulation scheme of the RF transmitter-receiver 42, further decodes the demodulated signal, and output the decoded signal to the MCU 46.

The MCU 46 performs control of the whole transmitter/receiver device. For example, the MCU 46 in a smart key generates a digital signal for keyless entry, and performs conversion into an analog signal and amplification by the amplifier 1, transmission from the antenna 40 via the RF transmitter-receiver 42, and a series of controls.

The modulator 48 performs conversion of the signal based on a command from the MCU 46, and modulation of the signal for communication. The modulator 48 outputs the modulated signal to the RF transmitter-receiver 42.

The amplifier 1 in the above embodiment is included, for example, in the RF transmitter-receiver 42 and executes amplification as explained above. The RF transmitter-receiver 42 transmits the amplified signal from the antenna 40. As explained above, the amplifier 1 according to the above embodiment can be used, for example, for modulation and amplification of the signal for keyless entry in the smart key.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, in the above embodiment, the n-type MOSFET may be replaced with a p-type MOSFET according to the situation, and vice versa. Further, the transistor is a MOSFET but may be appropriately replaced with another transistor such as a bipolar transistor.

The invention claimed is:

1. An amplifier comprising:
a first circuitry configured to control an enable signal;
a second circuitry configured to control a bias signal; and
a plurality of amplifier circuitries coupled to the first circuitry and to the second circuitry, wherein each of the plurality of amplifier circuitries is configured to generate a respective output signal, the output signal being decided from among the plurality of amplifier circuitries based on the enable signal, and each of the plurality of amplifier circuitries outputs the respective output signal amplifying an input signal with a gain corresponding to the bias signal,
wherein the first circuitry and the second circuitry control a rising of an output waveform at timing when the input signal is turned on and a falling of the output waveform at timing when the input signal is turned off and perform a control to make the output waveform of rising into a ramp-up and a control to make the output waveform of falling into a ramp-down.

2. The amplifier according to claim 1, wherein
the first circuitry and the second circuitry independently control the plurality of amplifier circuitries.

3. The amplifier according to claim 1, further comprising:
a control circuitry configured to independently control the first circuitry and the second circuitry.

4. The amplifier according to claim 3, wherein the control circuitry controls the first circuitry and the second circuitry at predetermined timing to shape the output waveform.

5. The amplifier according to claim 4, wherein
the control circuitry controls alternately the first circuitry and the second circuitry to shape the output waveform.

6. An amplifier comprising:
a first circuitry configured to control an enable signal;
a second circuitry configured to control a bias signal;
a plurality of amplifier circuitries coupled to the first circuitry and to the second circuitry, wherein each of the plurality of amplifier circuitries is configured to generate a respective output signal, the output signal being decided from among the plurality of amplifier circuitries based on the enable signal, and each of the plurality of amplifier circuitries outputs the respective output signal amplifying an input signal with a gain corresponding to the bias signal; and
a control circuitry configured to independently control the first circuitry and the second circuitry, wherein a control circuitry controls the first circuitry and the second circuitry alternately at predetermined timing to shape an output waveform.

7. The amplifier according to claim 6, wherein
the first circuitry and the second circuitry independently control the plurality of amplifier circuitries.

8. The amplifier according to claim 6, wherein the first circuitry and the second circuitry control a rising of the output waveform at timing when the input signal is turned on and a falling of the output waveform at timing when the input signal is turned off.

9. An amplifier comprising:
a plurality of amplifier circuitries each comprising:
a first transistor configured to output a first signal by an RF signal being applied thereto;
a second transistor coupled to the first transistor and configured to add bias to the first signal output from the first transistor by a bias control signal being applied thereto; and
a switch configured to select whether or not to output a signal from the first transistor or the second transistor;
a first circuitry configured to control switches of the plurality of amplifier circuitries to control which of the plurality of amplifier circuitries outputs the first signal; and
a second circuitry coupled to the second transistors of the plurality of amplifier circuitries to control magnitudes of the biases for the plurality of amplifier circuitries,
wherein the first circuitry and the second circuitry control a rising of an output waveform at timing when the input signal is turned on and a falling of the output waveform at timing when the input signal is turned off and perform a control to make the output waveform of rising into a ramp-up and a control to make the output waveform of falling into a ramp-down.

* * * * *